(12) United States Patent
Muthukrishnan et al.

(10) Patent No.: US 6,185,220 B1
(45) Date of Patent: Feb. 6, 2001

(54) GRID LAYOUTS OF SWITCHING AND SORTING NETWORKS

(75) Inventors: Shanmugavelayut Muthukrishnan, New York, NY (US); Suleyman Cenk Sahinalp, Summit, NJ (US); Michael S. Paterson, Leamington Spa (GB)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/097,878

(22) Filed: Jun. 15, 1998

(51) Int. Cl.$^7$ .................................................... H04L 12/28
(52) U.S. Cl. .......................... 370/411; 370/389; 370/394; 370/397
(58) Field of Search ..................................... 370/411, 389, 370/352, 394, 397; 340/825.79, 825.89

(56) References Cited

U.S. PATENT DOCUMENTS

| | | | |
|---|---|---|---|
| 4,905,224 | * | 2/1990 | Lobjinski et al. . |
| 5,216,420 | * | 6/1993 | Manter . |
| 6,018,523 | * | 1/2000 | Even ..................................... 370/389 |
| 6,021,131 | * | 2/2000 | Even ..................................... 370/411 |

OTHER PUBLICATIONS

"Improved Grid Layouts of Switching and Sorting Networks", S. Muthukrishnan, M. Paterson, and S. Sahinalp, 18 pages, unpublished.

* cited by examiner

Primary Examiner—Douglas W. Olms
Assistant Examiner—Ken Vanderpuye
(74) Attorney, Agent, or Firm—Synnestvedt & Lechner LLP

(57) ABSTRACT

A systematic method for creating layouts for various sorting and switching networks on VLSI chips is proposed. These sorting and switching networks include butterfly switching networks, benes networks, odd-even sorting networks, and bitonic sorting networks.

The present invention utilizes the existing VLSI grid-model to create various layouts. A rectangular layout is proposed which introduces the use of an additional row to create an area-efficient layout for various switching networks. A diamond layout is proposed which further improves rectangular layout by reducing the number of columns required. A suitable combination of diamond and rectangular layouts is also proposed.

11 Claims, 16 Drawing Sheets

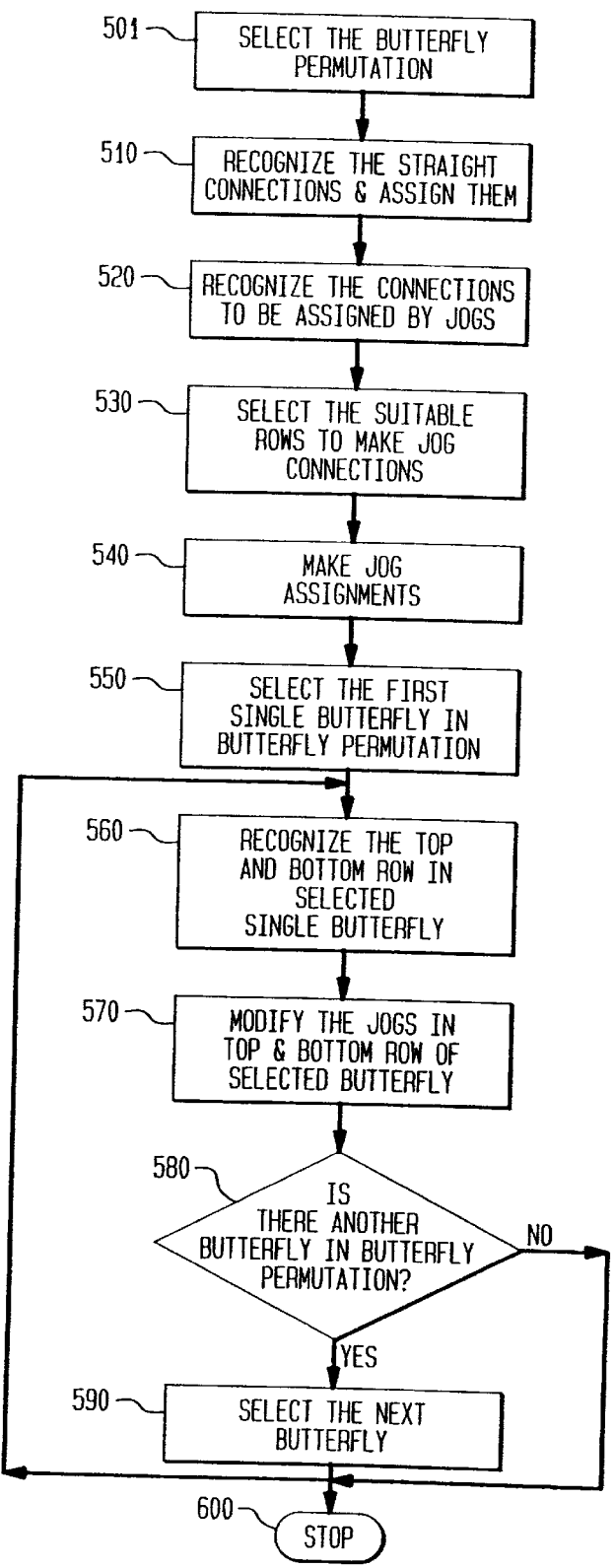

GRID LAYOUTS OF SWITCHING AND SORTING NETWORKS

This patent application contains an appendix (Appendix A) consisting of 18 pages, titled Improved Grid Layouts of Switching and Sorting Networks. Appendix A is an unpublished article written by the inventors of the present invention. The article comprises the results of the various experiments conducted by the inventors according to the principles of the current invention. The article also comprises various experimental techniques used by the inventors to conduct these experiments.

The enclosed article, attached as an Appendix A, is an expression of the embodiments included in this patent application. However, the information and the language of the article should not be construed as limiting the scope of the claims.

FIELD OF THE INVENTION

This invention generally relates to switching and sorting networks: including butterfly, benes network, odd-even sorter, and bitonic sorter. In particular, the invention relates to the layout of these switching and sorting networks on Very Large Scale Integrated (VLSI) chips.

BACKGROUND OF THE INVENTION

Sorting and switching networks are widely used as interconnection networks in telecommunications, parallel computing, and distributed computing.

There is a renewed interest in these networks in Asynchronous Transfer Mode (ATM) technology. ATM switches are commonly used in telecommunication networks to switch voice, data, and video. ATM switches deploy various sorting and switching networks to receive incoming packets and sort them according to destination.

In a typical ATM switch, these sorting and switching networks are systematically laid on a VLSI chip. However, the layouts of these sorting networks on VLSI chips have always been a problem. The sorting networks have connections which are angled in three dimensional space; wherein VLSI chips use a two dimensional grid-model comprising only horizontal rows and vertical columns. In this grid-model, various sorters and other network nodes are mapped to a subset of grid points, and the connections between the nodes are selected using the edge-disjoint wiring along grid rows and grid columns.

Therefore, there exists a need for an improved systematic method for laying out these sorting networks on VLSI chips. The goal is to produce an area-efficient layout. The production cost of a VLSI chip grows with the total area of its layout, and it is desirable to produce a layout of sorting networks on VLSI chips as compactly as possible.

SUMMARY OF THE INVENTION

The present invention provides a systematic method for creating layouts for various sorting and switching networks. These sorting and switching networks include butterfly switching networks, benes networks, odd-even sorting networks, and bitonic sorting networks.

The present invention utilizes the prior-art grid-model of VLSI chips. This grid-model comprises horizontal rows and vertical columns.

Two different layout schemes, termed rectangular and diamond, are proposed. The rectangular layout involves use of existing rows in an economical manner as well as use of one additional row. The diamond layout utilizes the columns efficiently and produces a layout comprising successive levels. The present invention also provides a layout comprising a suitable combination of the rectangular and diamond layouts.

In the preferred embodiment, a suitable rectangular layout for a single butterfly is proposed. In the alternative embodiments, suitable layouts for complete butterfly switching networks, odd-even sorting networks, and bitonic sorting networks are proposed.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 5 is a flow-chart illustrating the various steps involved in designing a rectangular layout for a butterfly permutation $B_{l,k}$;

DETAILED DESCRIPTION OF A PREFERRED EMBODIMENT

Figure 1:
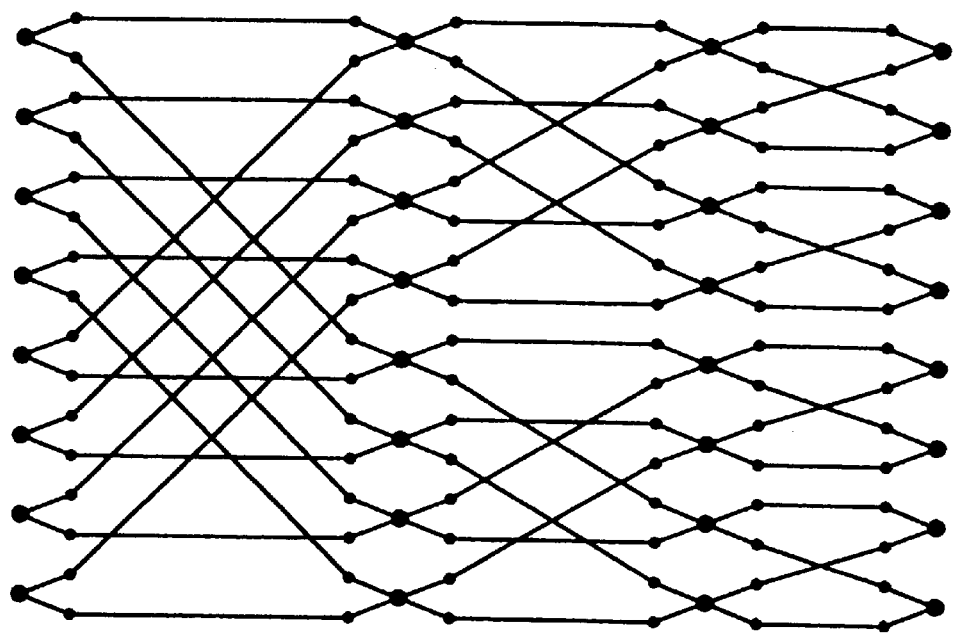
FIG. 1 is a wiring diagram illustrating an exemplary butterfly network with 8 input and 8 output nodes.

There are several sorting and switching networks presently in common use. Some of the commonly used sorters are: (1) butterfly switching networks; (2) benes networks; (3) odd-even sorting networks; and (4) bitonic sorting networks.

The present invention provides an area-efficient layout scheme for these sorting and switching networks on VLSI chips.

A "layout" of any of the sorting or switching networks on a VLSI chip is a mapping of the nodes of the network to the grid-points of the VLSI chips. In a VLSI chip, the horizontal grid-lines are laid out on one layer, and the vertical ones on another. Thus, there are two different layers. All sorting/switching network nodes operate on input from both layers and produce outputs in both layers.

The present invention utilizes the known features of VLSI chips. The connections of the sorting/switching networks are mapped to the edge-joint grid paths (that is rectilinear paths with corners only at grid-points). At most, only two paths can meet at a grid-point.

After the paths meet at a grid point, there are two different options. In the first option, termed "straight", neither path changes direction at the intersection point. In the second option, termed "knock-knee", both paths change directions at the intersection point simultaneously.

The present invention proposes two layout schemes for laying switching networks on VLSI chips, termed rectangular and diamond. The rectangular layout uses grid rows in an economical manner to produce an area-efficient layout. The diamond layout utilizes the grid columns efficiently and produces a layout which uses overlapping successive levels. The present invention also provides a layout comprising a suitable combination of the rectangular and diamond layouts.

Both, the rectangular and diamond layout utilize a single butterfly as a building block. Therefore, a single butterfly and networks comprising multiple butterflies and their layouts are of great interest.

A single butterfly $B_l$ is a bipartite graph with L input nodes and L output nodes, wherein l is the order of the bipartite graph, and $L=2^l$. Each input node $I_l[i]$, wherein $0 \le i \le L-1$ is connected to the two output nodes $O_l[i]$ and $O_l[i']$, and where i' denotes the binary number obtained by flipping the most significant bit of the binary number i.

A single butterfly $B_l$ is used to create a butterfly switch. In a butterfly switch, each node of the single butterfly $B_l$ is replaced by a two-input, two-output switch. In particular, this implies that the input comprises M=2N lines and output comprises M=2N lines. Similarly, replacing each node of a single butterfly $B_l$ with a two-input, two-output comparator (rather than a switch) creates a butterfly comparator. Switches and comparator will hereinafter be referred to collectively as selectors for ease of reference.

A plurality of single butterflies are used to create a butterfly permutation. A butterfly permutation $B_{l,k}$ is a bipartite graph with L input and L output nodes, wherein $k \le l$. Each input node $I_{l,k}[i]$, $0 \le i \le L-1$ is connected to $O_{l,k}[i]$, and $O_l[i^{k}]$ where $i^k$ denotes the binary number obtained by flipping the k most significant bits of the binary number i.

A plurality of single butterflies, located in different levels, are used to create a complete butterfly network $B^n$. A complete butterfly network $B^n$ is a network comprising multiple single butterflies in n different levels (1, 2, 3, 4 - - -, n). Each level is a bipartite graph with N input and N output nodes comprising N/L independent single butterflies $B_l$ of L input and L output nodes.

FIG. 1 is a wiring diagram illustrating an exemplary single butterfly with $L=2^3$, i.e., having 8 input and 8 output nodes. There are three different levels. The first level comprises 8×8 (N/L) independent butterflies. The second level comprises 4×4 (N/L) independent butterflies, and the third level comprises 2×2 (N/L) butterflies.

In a preferred embodiment of the present invention, a rectangular layout is proposed for a single butterfly $B_l$.

Figure 2:
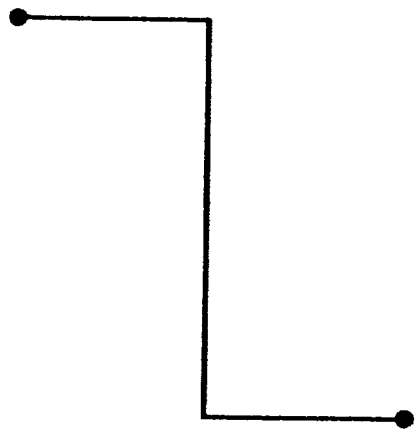
FIG. 2 is a wiring diagram illustrating an exemplary first type of jog, a down-jog.

To accomplish this layout, the present invention uses "jogs" and straight connections. A jog is a horizontal-vertical path from input node $(r_1,0)$ to output node $(r_2,x)$ with a vertical segment on some column c, wherein $r_1, r_2$ are the row numbers, 0, 1, 2, 3, - - -, c, - - - x are the column numbers between rows $r_1$ and $r_2$, and $0<c<x$. There are two types of jogs. A down-jog is a jog that has source $(r_1,0)$ and destination $(r_2,x)$ wherein $r_1<r_2$. FIG. 2 is a wiring diagram illustrating an example of a down-jog.

Figure 3:
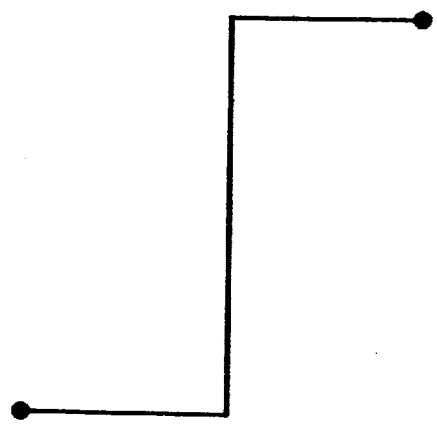
FIG. 3 is a wiring diagram illustrating an exemplary second type of jog, an up-jog.

An up-jog is a jog with source $(r_1,0)$ and destination $(r_2,x)$ such that $r_1>r_2$. FIG. 3 is a wiring diagram illustrating an example of an up-jog.

A straight connection is a horizontal path from input $(r_1,0)$ to output $(r_1,x)$.

Figure 4:
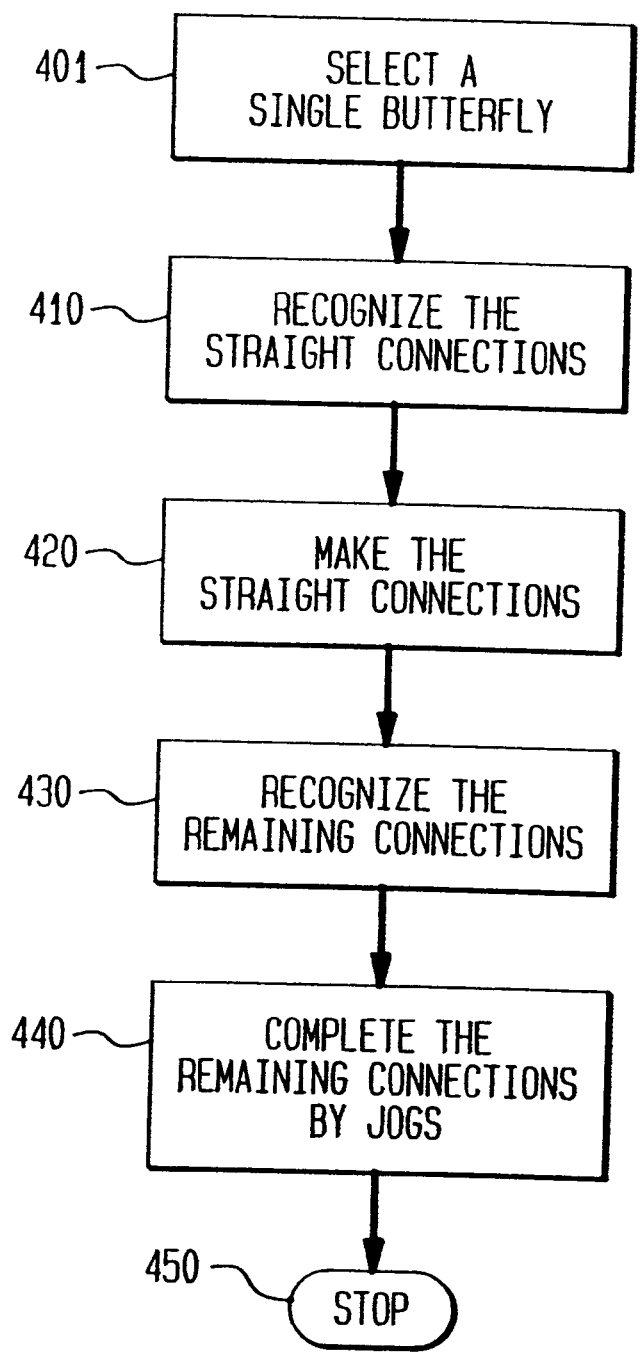
FIG. 4 is a flow-chart illustrating the different steps performed steps performed to design a rectangular layout for a single butterfly $B_l$.

FIG. 4 is a flow-chart illustrating the steps performed to design a rectangular layout for a single butterfly $B_l$.

The first step 401 is to select an appropriate butterfly $B_l$, block 401. A typical butterfly $B_l$ has L input nodes with its 2L input lines, which are mapped to the grid on the VLSI chip. It also has L output nodes with 2L output lines which are also mapped to the grid on the VLSI chip.

For butterfly $B_l$, the L input nodes with 2L input lines will be mapped to grid points (0,0), - - -,(2L−1,0). The mapping from input node i to its two input lines will be 2i and 2i+1, respectively. The butterfly also consists of L output nodes with their output lines mapped to rows (1,L+1), - - - (2L,L+1). The mapping from output node i to its two output lines will be 2i and 2i+1, respectively.

In the preferred embodiment, the present invention introduces use of an additional row to design an optimal rectangular layout. Thus, the rectangular layout will use 2L+1 rows and L columns. These rows and columns will be using straight connections and jogs to complete the design of the layout.

The next step, block 410, is to recognize the straight connections, which are assigned first. In butterfly $B_l$, the (2i+1,0) input lines are connected to (2i+1, L+1) output lines via straight connections in step 420. The next step 430 is to recognize connections which are assigned by jogs. In butterfly $B_l$, the remaining input lines (2i,0) are connected to the (i'+2, L+1) output lines via jog connections in step 440. i' denotes a binary number obtained by flipping the first two most significant bits of the binary number i. It is important to note the connection of (2i, 0) does not extend to (i', L+1), but rather extends to (i'+2, L+1) due to the presence of an additional row. The use of an additional row is essential as this row enables the successful implementation of jogs for the above input lines to output lines connection.

After the straight connections and jog connections are complete in step 450, the end result is a successful layout design for a butterfly network on a VLSI chip.

Figure 4A:
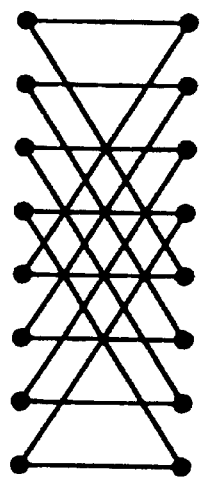
FIG. 4A is a wiring diagram illustrating an exemplary single butterfly with 8 input/nodes and 16 input/output lines.
Figure 4B:
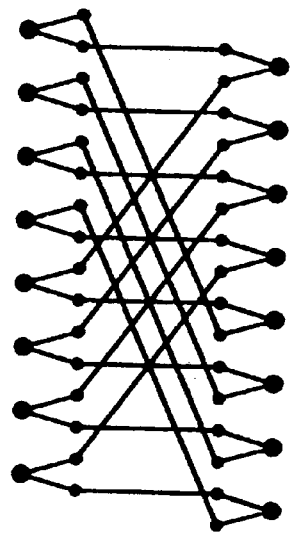
FIG. 4B is a wiring diagram illustrating the straight input and output line assignments on the grid for the single butterfly of FIG. 4A.
Figure 4C:
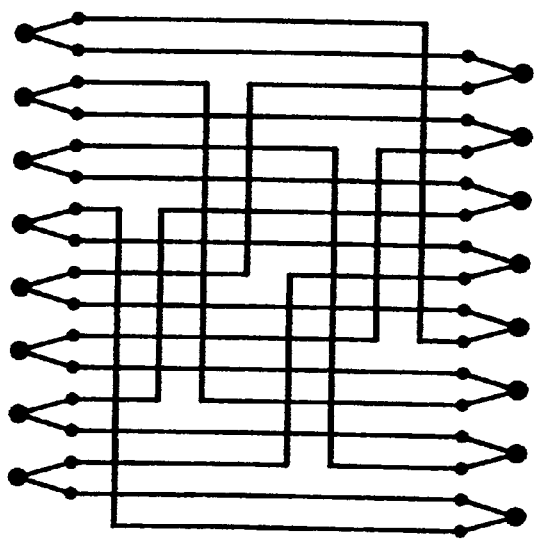
FIG. 4C is a wiring diagram illustrating the selection and implementation of jog assignments for the single butterfly of FIG. 4A.

FIG. 4A, 4B, 4C illustrate the above rectangular layout scheme for a single butterfly B, in the form of an example.

FIG. 4A is a wiring diagram illustrating a single butterfly with 8 input/output nodes with 16 input/output lines after the performance of step 401.

FIG. 4B is a wiring diagram illustrating the butterfly of FIG. 4A after the straight connections have been realized and implemented in step 410 and step 420. Every other line is a straight connection.

FIG. 4C is a wiring diagram illustrating the selection and use of jogs to complete the rest of the assignments in step 430 and step 440.

In a second embodiment, the above principles of a single butterfly are used to create rectangular layouts for butterfly permutations.

FIG. 5 is a flow-chart illustrating the various steps involved in designing a rectangular layout for a butterfly permutation $B_{l,k}$ with 2L+1 input rows and L-1 columns, wherein $B_{l,1}$ is the single butterfly.

The first step 510 in designing a rectangular layout for $B_{l,k}$ is to recognize straight connections and implement them. Then, the next step 520 is to recognize connections which must be assigned by jogs.

The next step 530, is to recognize the column assignment of jogs to the corresponding input rows. For a butterfly permutation $B_{l,k}$ the column assignment of a jog to an input row r is given by the following function f(r):

$f(r)=L-2i+1$, for $r=4i$ $f(r)=L-(rl'^*/2)+1$, for $r=4i+2$, wherein l' denotes a binary number obtained by flipping the first two most significant bits of the binary number l. For example if l=3, the corresponding binary number for l is 011, the l' will be 101 (8).

By using the above function f(r), the jogs are assigned to suitable columns, step 540. This completes the generic rectangular layout for butterfly permutation.

In this embodiment, the above layout is further improved for a butterfly permutation network $B_{l,k}$ comprising multiply butterflies by modifying the layout of some of the jogs. This step is termed melding.

The melding is performed for each butterfly in the butterfly permutation by selecting a single butterfly $B_l$ at a time in step 550.

In the melding operation, for a single butterfly $B_l$ all the straight connections and all the jogs are retained except the jog on the top row (row 0) and the bottom row (2L) in step 560. The jogs in the top row and bottom row are modified to include several new turns. The purpose of melding is to create alternate upslots and downslots in the top and bottom row.

Figure 6:
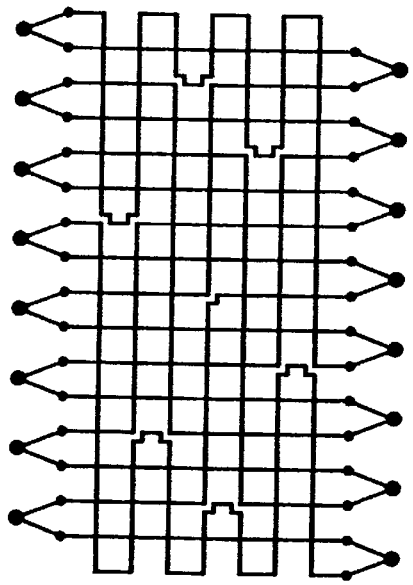
FIG. 6 is a wiring diagram illustrating an exemplary butterfly with 8 input/output nodes, and 16 input/output lines without melding.

An upslot is a turn made in wiring by having an up-jog and a down-jog in consecutive columns. Similarly, a downslot is a turn made by having a down-jog and an up-jog in consecutive columns. Thus, in the present invention (r,c):(r,c+1), is an upslot if the jog with source (r,0) is an up-jog with column assignment c, and the jog with destination (r,x) is a down-jog with column assignment c+1. In this embodiment, $r_1, r_2, r_3 \ldots r$ are row numbers, c is a particular column number, and x is $0 \leq i \leq c$. Similarly, (r,c):(r,c+1) is a downslot if the jog with source (r,0) is a down-jog with column assignment c, and the jog with destination (r,x) is an up-jog with column assignment c+1. FIG. 6 illustrates an exemplary up-slot 610 and down-slot 620.

In next step 570, jogs are modified to create alternate upslots and downslots. After modification, a typical jog in bottom row 2L will go through (2L,1), (2L,2), $(r_2,2)$, $(r_2,3)$, (2L,3), (2L,4), $(r_4,4)$ - - - etc., where $(r_2,2):(r_2,3)$, $(r_4,4):(r_{31}5)$ - - - are upslots. Similarly, the jog in row 0 goes through (0,0), (0,1), $(r_1,1)$, $(r_1,2)$, (0,2), (0,3), $(r_3,3)$, $(r_3, 4)$, (0,4) . . . etc, where $(r_1,1):(r_1,2)$, $(r_3,3),(r_3,4)$ . . . are downslots.

After melding, there is precisely one upslot or one downslot between two consecutive columns. Therefore, between columns c and c+1, there is one upslot or one downslot. Also, upslots and downslots alternate between columns. Thus, if there is an upslot between column c and c+1, then there must be a downslot between column c+1 and c+2, and vice-versa.

FIG. 6 is a wiring diagram illustrating an exemplary butterfly with 8 input/output nodes after the melding is complete and the upslots and downslots have been arranged in alternating columns.

The next step 580 is a decision function to determine whether there is another butterfly in the butterfly permutation $B_{l,k}$ which needs to be covered by melding.

If yes, the next butterfly is selected in step 590, and the melding operation iteration is repeated starting from step 560. The method ends in step 590 after the melding for all the butterflies is complete.

After the melding is completed for all the butterflies in the butterfly permutation $B_{l,k}$, the various butterflies with rectangular layouts can now be stacked at each other while using only one additional row for the whole butterfly permutation $B_{l,k}$. As no two lines have common row portions because of the alternating upslots and downslots, the successive copies of single butterfly $B_l$ in butterfly permutation $B_{l,k}$ commonly share their adjacent rows. That is, the bottom-most row of the upper butterfly and the top-most row of the lower butterfly comprise the same grid line. Accordingly, when the butterflies are combined in this manner, there are N−1 fewer rows than if the butterflies were simply stacked on top of each other.

After the melding, the rectangular layout for a butterfly permutation $B_{l,k}$ is complete.

Figure 7:
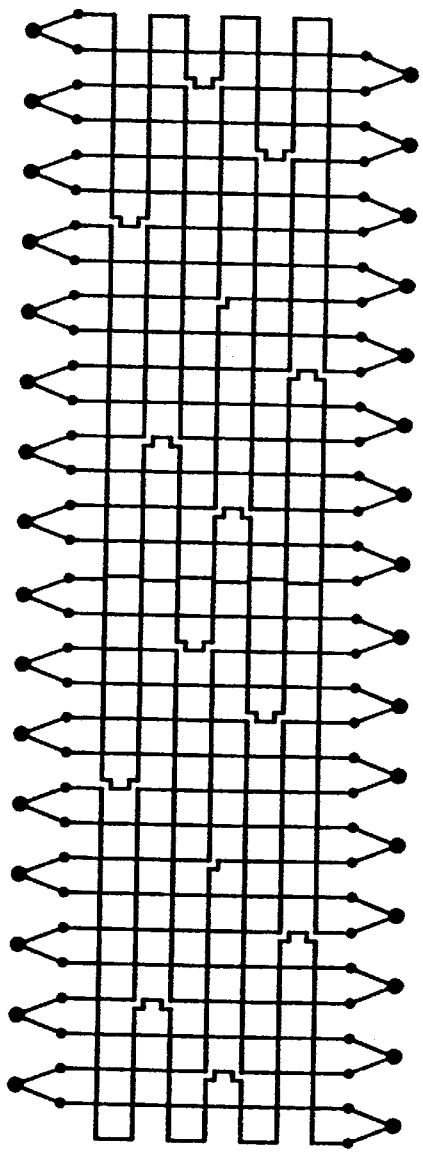
FIG. 7 is a wiring diagram illustrating an example of a butterfly permutation $B_{l,k}$ (after melding) with only one additional row used to complete rectangular layout on a typical VLSI chip.

FIG. 7 is a wiring diagram illustrating an example of a typical butterfly permutation $B_{l,k}$ with only one additional row added to complete the rectangular layout on a typical VLSI chip.

In a third embodiment, the rectangular layout of a butterfly permutation $B_{l,k}$ as generated by the steps shown in FIG. 5, is further improved. This improvement is termed row-exchange.

Figure 8A:
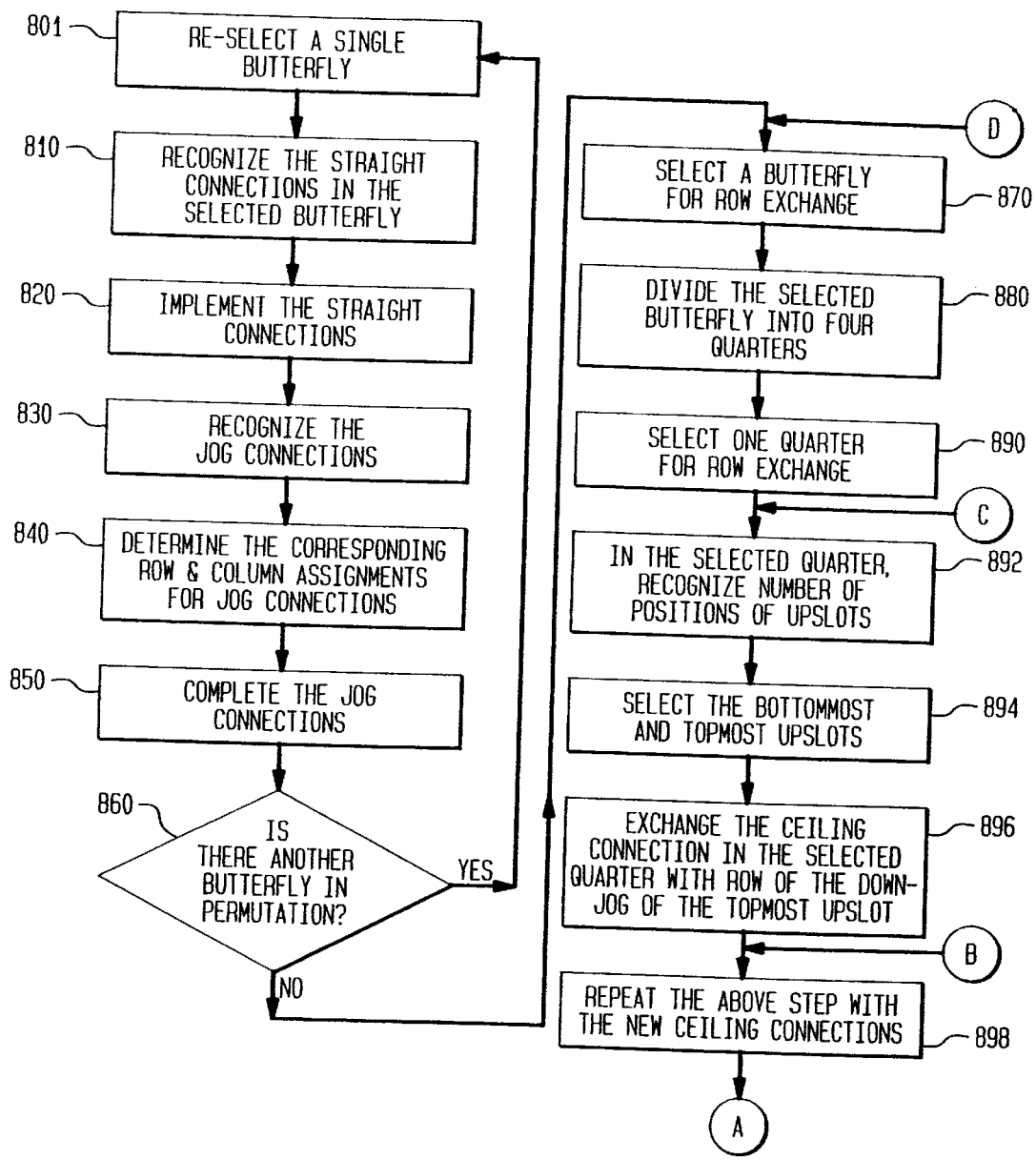
FIGS. 8A and 8B are flow-charts illustrating the various steps involved in designing an improved rectangular layout for a butterfly permutation $B_{l,k}$.
Figure 8B:
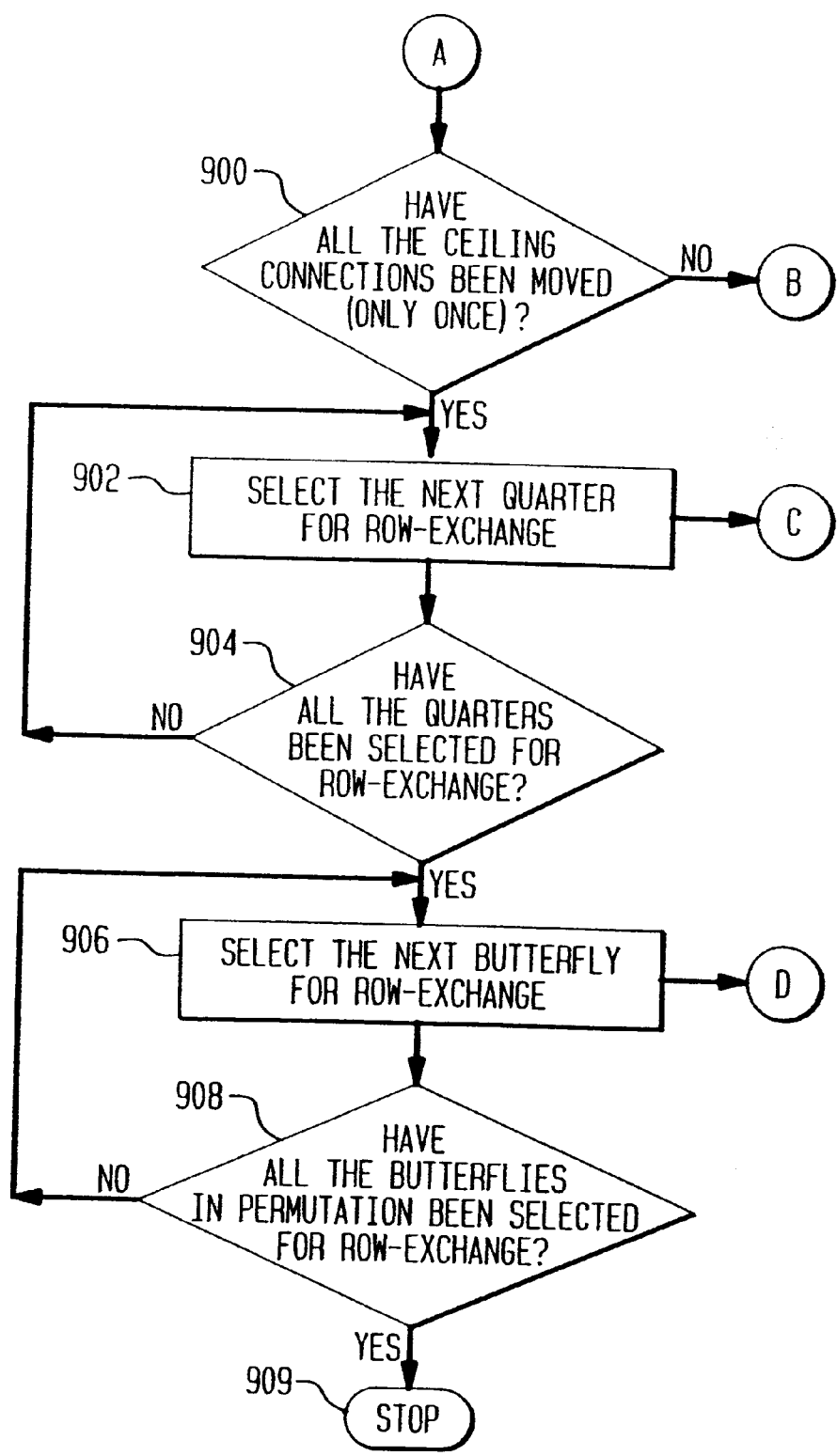

FIGS. 8A and 8B are flow-charts illustrating various steps of this embodiment.

In this embodiment, the first few steps to create a generic rectangular layout for a butterfly permutation $B_{l,k}$ are the same. The first step 810 to designing a rectangular layout for $B_{l,k}$ is to recognize straight connections. The second step 820 is to implement them. Then, the next step 830 is to recognize connections which must be assigned by jogs.

The next step 840 is to recognize the column assignment of jogs to the corresponding input rows. For a butterfly permutation $B_{l,k}$, the column assignment of a jog to an input row r is given by the following function f(r):

$$f(r)=L-2i+1, \text{ for } r=4i$$

$$f(r)=L-(rl'^*/2)+1, \text{ for } r=4i+2,$$

wherein l' denotes a binary number obtained by flipping the first two most significant bits of the binary number l.

By using the above function f(r), the jogs can be assigned to suitable rows in step 850. After rectangular layout is complete for all the butterflies This completes the generic rectangular layout for a butterfly permutation $B_{l,k}$.

The next operation is row-exchange. In row-exchange, the number of knock-knees required in a rectangular layout for a butterfly permutation $B_{l,k}$ are reduced. The knock-knees are turns in wire connections and are expensive to fabricate on a VLSI chip.

As the number of knock-knees are reduced, the cost of fabrication also is reduced.

In the present embodiment, the next step 870, is to select a butterfly $B_l$ upon which to perform row-exchange. The row-exchange is performed sequentially on each butterfly $B_l$ of a butterfly permutation $B_{l,k}$. The row-exchange is performed right after implementation of jogs, but before any modification by melding.

Figure 9A:
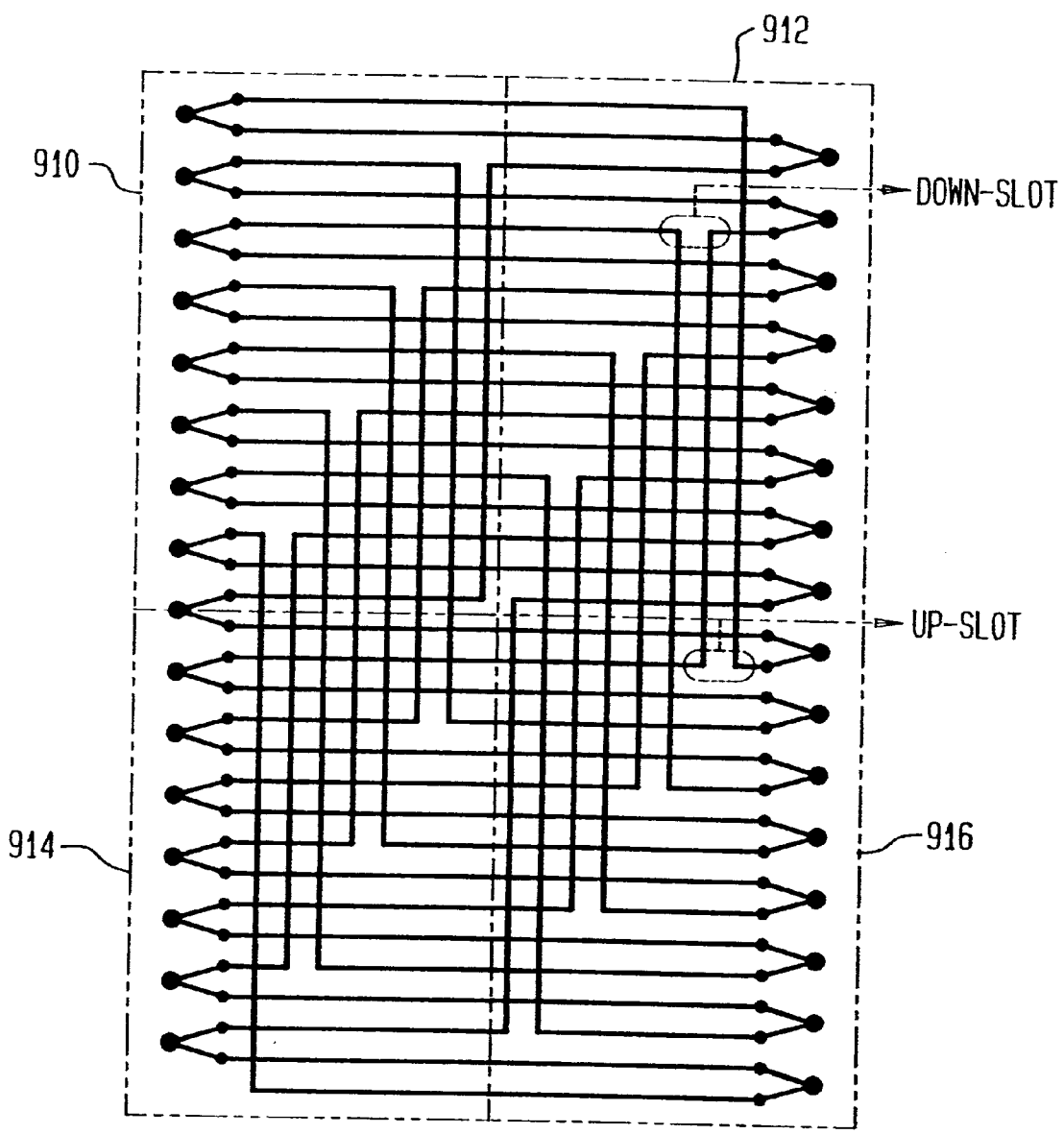
FIG. 9A is a wiring diagram illustrating an exemplary butterfly with 16 input/output nodes and 4 quarters.

FIG. 9A is a wiring diagram illustrating a typical example of a rectangular layout of butterfly $B_l$ with 16 input/output nodes. The example illustrates the rectangular layout after implementation of jogs, but before any modifications by melding.

The purpose of row-exchange is to rearrange the rows such that there is a constant number of knock-knees per connection. As shown in FIG. 9A, all jogs in a rectangular layout of $B_{l,k}$ have two knock-knees each, except the topmost and the bottom-most connections in each copy of the butterfly $B_l$. Thus, the number of knock-knees in these two connections must be reduced to have a constant number of knock-knees per connection.

To perform row-exchange, the next step 880 is to select the rectangular layout for the selected butterfly and divide it in four quarters, top-left, top-right, bottom-left, and bottom-right.

In FIG. 9A, four quarters are termed top-left 910, top-right 912, bottom-left 914, and bottom-right 916.

To begin, only one quarter is selected to perform a row-exchange iteration in step 890. In the example of FIG. 9A, the row-exchange is first applied to top-left quarter 910.

Figure 9B:
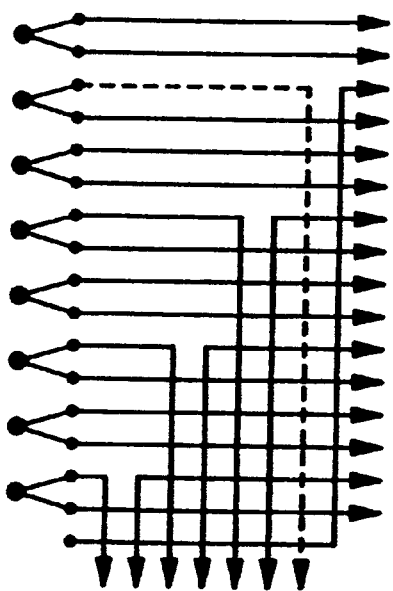
FIG. 9B is a wiring diagram illustrating the top-left quarter of the butterfly shown in FIG. 9A.

The next step 892 is to recognize the number and positions of upslots in top-left quarter 910. FIG. 9B is a wiring diagram illustrating the top-left quarter 910 after the implementation of jogs, but before any row-exchange.

In top-left quarter 910, the upslots, looking from left to right, have decreasing row indices. Specifically, they are located at positions (L−2,1):(L−2,2), (L−6,3):(L−6,4), . . . L(4i+2),2i+1):(L−(4i+2),2i+2), . . . , (2,L/2−1):(2,L/2).

The next step 894, is to select the bottommost (also leftmost) upslot (L−2,1):(L−2,2) and the topmost (also rightmost) upslot (2,L/2−1):(2,L/2).

The next step 896, is to exchange the row of the ceiling connection with the row of the down-jog of the topmost upslot (2,L/2−1):(2,L/2), wherein ceiling connection is the topmost row in the top-left quarter 910. To accomplish this, the straight row segment of ceiling connection between (0,1) and (0,L/2) is moved to (2,1) and (2,L/2) in a systematic manner. It is important to avoid column conflicts, e.g., locations (2,2) and (2,0) cannot be connected by column segments. Therefore, the straight row segment of the down-jog of the topmost upslot between (2,1) and (2,2) is moved to the row of the bottommost upslot (L−2,1):(L−2,2). Then locations (L−2,1), (2,1), and the locations (L−2,2), (2,2) are connected by the column segments.

Figure 9C:
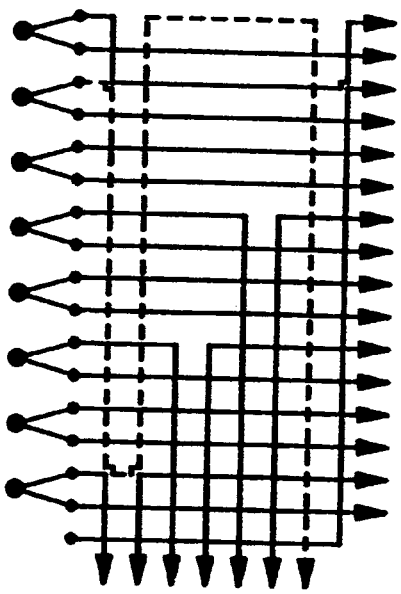
FIG. 9C is a wiring diagram illustrating the top-left quarter of FIG. 9B after a row-exchange between the ceiling connection and a straight row connection.

This completes the row exchange between the ceiling connection and the row segment of the down-jog of the topmost up-jog. In a typical butterfly $B_l$, the topmost and the bottommost up-slots will be moved to row 0. FIG. 9C is a wiring diagram illustrating a typical row-exchange between the ceiling connection with straight row connection of the down-jog of the topmost upslot in top-left quarter 910. Note that as a result of row exchange, both the topmost and the bottommost upslots are moved to row 0.

The above iteration of row-exchange is repeated to move the new ceiling connection to another row in step 898. Once a ceiling connection is moved, it is never exchanged again. The row-exchange operation ends after all the rows in the top-left quarter 910 have been exchanged.

The knock-knees incurred during this operation will be constant per connection as they are generated during the row exchanges which are performed at most twice per connection. For example, row 0 will be exchanged with row 2, and then row 2 will be exchanged with row 4.

Figure 9D:
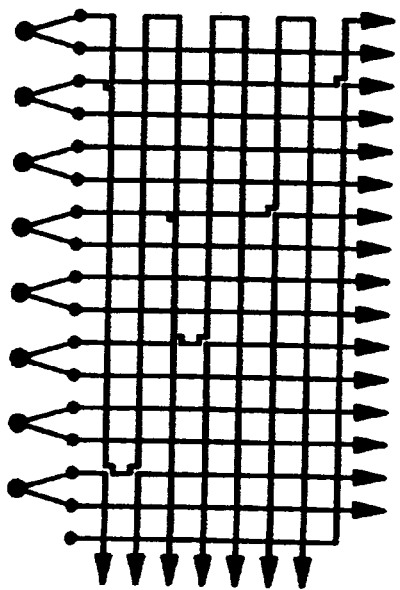
FIG. 9D is a wiring diagram illustrating the top-left quarter of FIG. 9A after completion of the row-exchange operation.

FIG. 9D is a wiring diagram illustrating the top-left quarter 910 of FIG. 9B with constant knock-knees per connection after implementation of row exchange.

The above iteration of row exchange operation is performed in all four quarter 910, 912, 914 and 916 of a butterfly Be independent of each other in step 902.

Once the above row-exchange is completed for one butterfly, it is iteratively repeated for other butterflies in the butterfly permutation $B_{l,k}$ in step 906. After the row-exchange operation is completed for all the butterflies, the result in step 909 is a rectangular layout for a butterfly permutation $B_{l,k}$ with constant number of knock-knees per connection.

Once the row-exchange operation is completed for all the butterflies, the method for designing a rectangular layout for a butterfly permutation $B_{l,k}$ proceeds with melding.

In a fourth embodiment of the present invention is proposed a diamond layout for a complete switching butterfly network. This is a modification to the previously described rectangular layout.

In the previous embodiments, it has been shown that L columns are necessary for a rectangular layout of the butterfly $B_l$. However, L columns are only necessary for the middle rows within a grid. Therefore, one can achieve even greater area-efficiency by reducing the number of columns towards the top and bottom of the rectangular layout.

The present embodiment proposes a method to reduce the number of columns used towards the top and bottom of the layout. The resulting layout is termed a diamond layout. A diamond layout has greater area efficiency than a rectangular layout.

The diamond layout uses about L columns at the middle of its grid. The number of columns used are then tapered linearly to zero at the extreme points.

In a diamond-layout, non-straight connections are assigned first, and the straight connections are assigned last.

The first step for creating a diamond layout for a butterfly $B_l$ is to create a grid comprising L−1 columns and 2L+1 rows. This step is similar to creating a rectangular layout.

The next step is to reduce the above-mentioned grid to an active region within the grid. This active region is a diamond-shaped region bounded by the following input and output lines. The input line t begins at:

(−(t+3)/2, L−t+1) for 1≤t≤L;

and (−(L+4−t)/2, L−t) for L≤t≤2L.

The output lines terminate at:

((t+3)/2, L−t+1) for 1≤t≤L;

and ((L+4−t)/2, L−t) for L≤t≤2L.

According to the principles of the present embodiment, this diamond shaped region is uniform and geometric in nature. This diamond-shaped region comprises various disjoint paths between different pair of nodes. In the next step, this diamond-shaped region interchanges the top and bottom halves of the inputs, without changing their internal orders. This step occurs prior to locating nodes at their corresponding grid-points. The resulting layout is a folded version of the preliminary diamond-shaped region. In this folded version, there are no collisions, but some knock-knees and extra bends are created. Then, the nodes are assigned to various grid points.

Only a portion of the input pattern paths change their position. In an exemplary butterfly $B_l$ with l=4, the diamond-shaped region will implement the following input sequence: L+2, 2, L+4, 4 . . . , 2L, L, L+1, 1, L+3, 3, . . . 2L−1−1, L−1.

Figure 10:
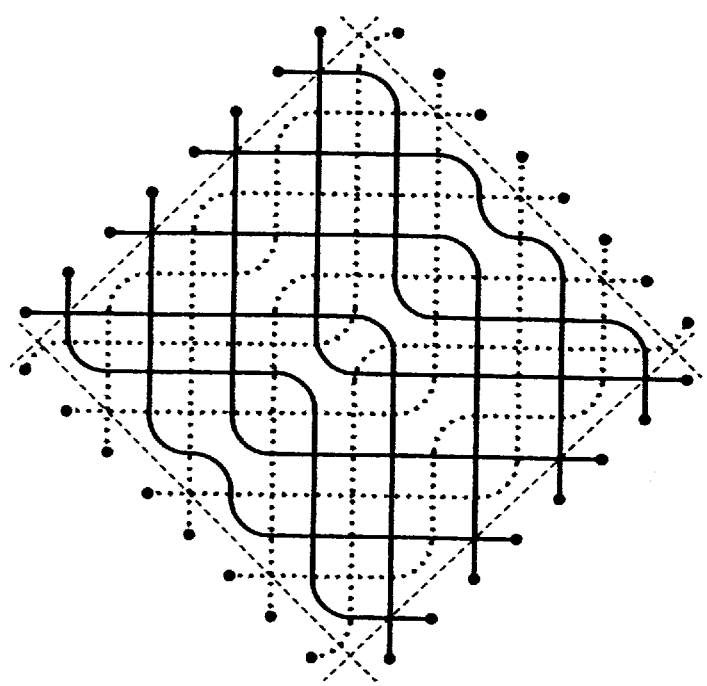
FIG. 10 is a wiring diagram illustrating a preliminary diamond layout for a butterfly network.

Out of the above-mentioned input sequence, the pattern of paths for the inputs which will change position is 1, 3 . . . , L−1, L+2, L+4, . . . , 2L FIG. 10 is a wiring diagram illustrating an example of this diamond shaped region for a butterfly $B_l$ with l=4 and L=16. In FIG. 10, the dotted lines represent various mirrors in which top and bottom halves of the inputs are about to interchange.

Figure 11:
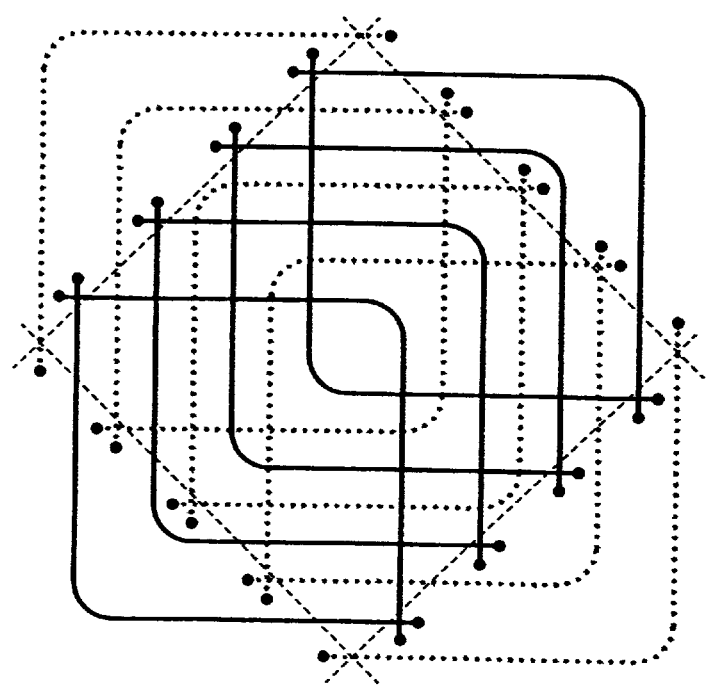
FIG. 11 is a wiring diagram illustrating a folded version of a preliminary diamond layout of FIG. 10.

FIG. 11 is a wiring diagram illustrating a folded version of the diamond shaped region of FIG. 10 after the patterns for paths have changed positions. FIG. 11 also illustrates various nodes located at their corresponding grid-points.

After all the non-straight connections have been assigned, the next step is to assign straight-through connections for remaining inputs. This step is accomplished by adding new rows to the folded diamond-shaped region. One row is added for each straight-through connection, thereby doubling the height of the folded diamond-shaped region. The resulting layout is the desired diamond layout.

Figure 12:
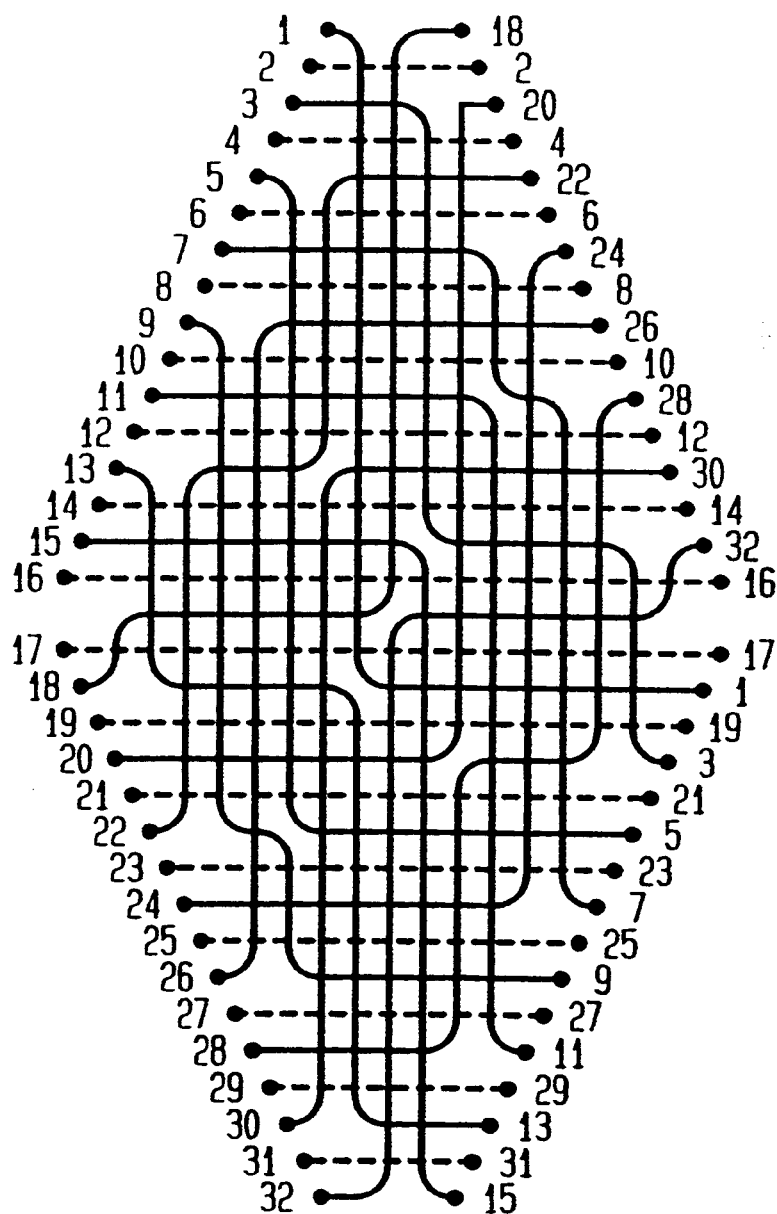
FIG. 12 is a wiring diagram illustrating a complete diamond layout of the butterfly network of FIG. 10 after straight connections have been added.

FIG. 12 is a wiring diagram illustrating a diamond layout for a butterfly $B_l$ with t=4.

In a fifth embodiment of the present invention, a diamond-rectangular combination layout is proposed for a complete butterfly switching network.

In a diamond-rectangular combination layout for a complete butterfly switching network, the key is to repeatedly use diamond layouts and then repeatedly use rectangular layouts.

Figure 13:
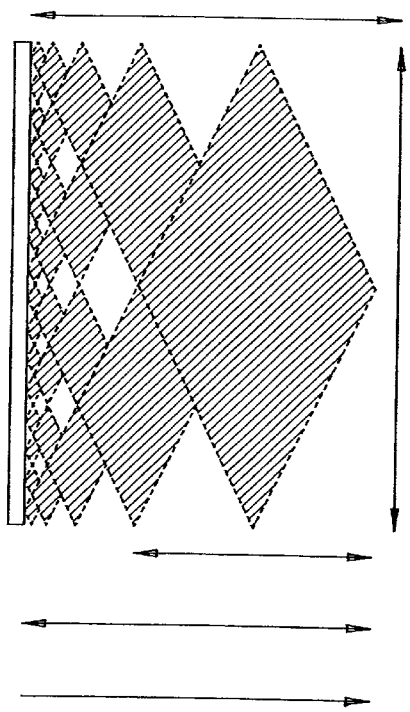
FIG. 13 is a wiring diagram illustrating a diamond-rectangular layout according to the principles of the present invention for a complete butterfly switching network.

FIG. 13 is a wiring diagram illustrating an example of a diamond-rectangular combination layout for a complete butterfly switching network, comprising n levels (1, . . . , n) and a plurality of butterflies. In this butterfly switching network each butterfly has $N=2^n$ input nodes and hence M=2N inputs.

This layout has two parts—Part 1 and Part 2. Part 1 comprises a diamond layout for levels n, n−1, . . . n−l+1. Part 2 comprises a rectangular layout for levels n−l, n−l−1 . . . 1.

The number of rows in Part 1 is $M+2^l$ this is because one additional row per butterfly with $M/2^k$ input nodes in any level k, wherein k is a typical level between 1, 2, 3 . . . , n, is introduced and there are $2^k$ butterflies in level k.

The number of columns in Part 1 is ≤3M/4, thus Part 1 has grid area at most $[3M^2/4 + 3M2^{l-3}]$.

The number of rows in Part 2 is also $M+2^l$. The number of columns are $2^{n-l-1}$. The grid area of Part 2 is $[M2^{(n-l-1)} + 2^{n-1}]$.

The total grid area by Part 1 and Part 2 is further minimized by making l=n/2. Thus, for a complete butterfly switching network with n levels and M input lines, the resulting grid area is $[3M^2/4 + O(M^{3/2})]$.

The straight connections in Part 1 are further aligned by extending the extra row introduced by each diamond right through any other diamonds overlapping that row.

The diamond-rectangular combination is the most efficient layout for a complete butterfly switching network. However, in alternative embodiments, straight diamond or straight rectangular layouts may be used.

In our example, a straightforward repeatedly rectangular layout for a complete butterfly switching network with n levels will yield a grid area of $[M^2 + O(M)]$. Similarly, by only repeating the diamond layout, the grid area will be $[3M^2/2 + O(M)]$. By comparison, it is clear that the diamond-rectangular combination layout is the most area-efficient with a grid area of $[3M^2/4 + O(M^{3/2})]$.

In a sixth embodiment, the principles of the present invention are used for creating a layout for benes networks.

A benes network is a sorting network which uses several complete butterfly networks as building blocks. A benes network of $N=2^n$ input nodes and N output nodes (hence M=2N input lines and M=2N output lines) is a concatenation of butterflies $[B_n'', B_{n-1}'', \ldots B_1''], [B_1''', B_2''', \ldots B_n''']$ in that order. In a simpler form, it comprises two complete butterfly networks connected end to end, in which the first butterfly has reversed levels. A benes network is a rearrangeable network, that is any permutation of the input items can be obtained on the output lines by an appropriate settings (straight or crossing) of each of the butterflies.

Figure 14:
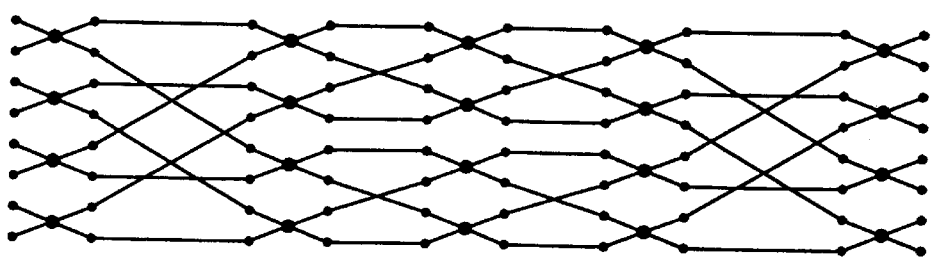
FIG. 14 is a wiring diagram illustrating an exemplary benes sorting network with $N=2^3$ input and output lines.

FIG. 14 is a wiring diagram illustrating an example of a benes network with $M=2^3$ input and $M=2^3$ output lines.

In the present embodiment, the present invention proposes a diamond-rectangular combination layout for benes networks.

First, the principles of rectangular and diamond layouts are used to create a diamond-rectangular combination layout for each of the complete butterfly networks comprised in the benes network. Then, the butterflies are put together to form a benes network.

Figure 15:
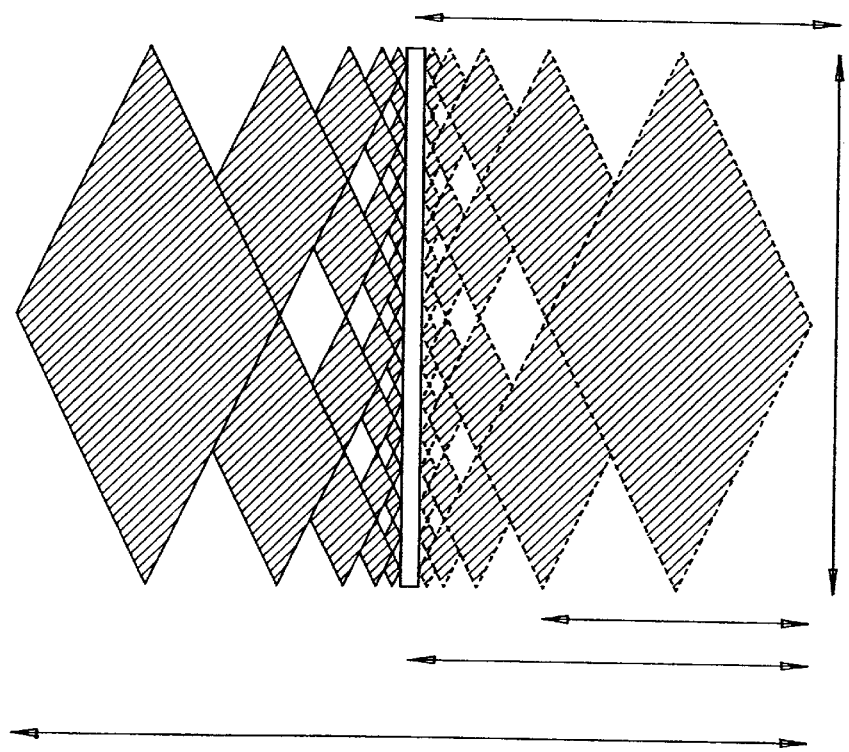
FIG. 15 is a wiring diagram illustrating a diamond-rectangular layout, according to the principles of the present invention, for a benes sorting network.

As a typical benes network is made of two complete butterfly networks, with one complete butterfly network in reverse levels, an example of diamond-rectangular layout for a benes network is shown in FIG. 15.

Following the principles of the above embodiments, the total grid area for a diamond-rectangular layout for a benes network with M input lines will be $[3M^2/2 + O(M^{3/2})]$.

In a seventh embodiment, the principles of the current invention are applied to create a layout for an odd-even sorting network.

The odd-even sorting network $OET_m$ is a merger network. The odd-even merger $OE_m$, in an odd-even sorting network $OET_m$, has two input vectors of M/2 elements and one output vector of M elements. The first input vector is X[0,1, ... M/2−1] and the second input vector is X[M/2, M/2+1 ..., M−1]. The output vector of M elements is Y[0,1, ..., M−1]. The output of the odd-even merger $OE_m$, comprises the elements of X[0, 1, ... M/2−1] and X[M/2, M/2+1 ... M−1], in a sorted order.

Figure 16A:
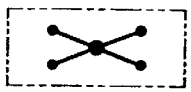
FIGS. 16A, 16B, and 16C are wiring diagrams illustrating a recursive construction of an exemplary odd-even merger network with 2, 4, and 8 input and output lines respectively.
Figure 16B:
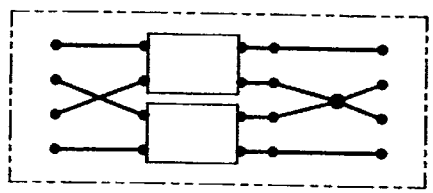
Figure 16C:
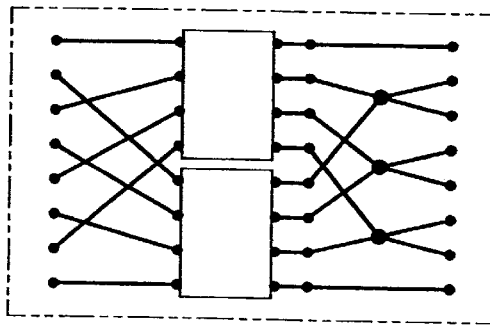

The structure of odd-even merger $OE_{m+1}$ is created recursively. $OE_l$ is a single comparator. $OE_{m+1}$ comprises two copies of $OE_m$ each termed upper and lower, respectively. FIGS. 16A, 16B, and 16C are wiring diagrams illustrating a recursive construction of an exemplary odd-even merger network with 2, 4, and 8 input and output lines, respectively.

Figure 17:
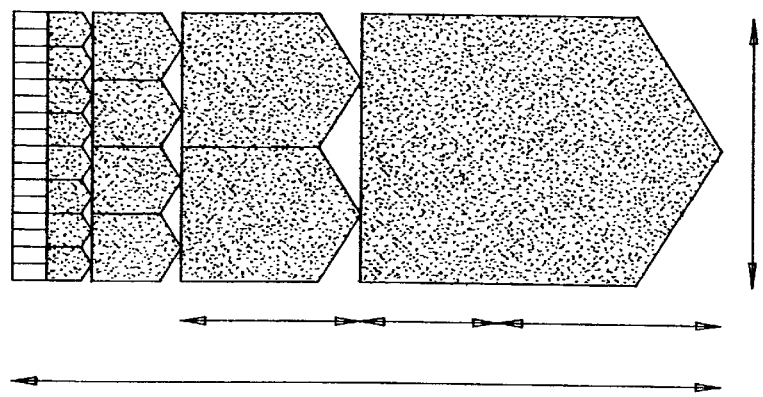
FIG. 17 illustrates a diamond-rectangular layout according to the principles of the present invention for a complete odd-even sorting network.

The odd-even sorter $OES_{m+1}$ for $M=2^m$ inputs is also constructed recursively: $OES_l$ is a single comparator, and $OES_{m+1}$ comprises an upper $OES_m$ and a lower $OES_m$ whose outputs are the inputs to a copy of odd-even merger $OE_{m+1}$. FIG. 17 is a wiring diagram illustrating an example of an odd-even sorting network.

Figure 18:
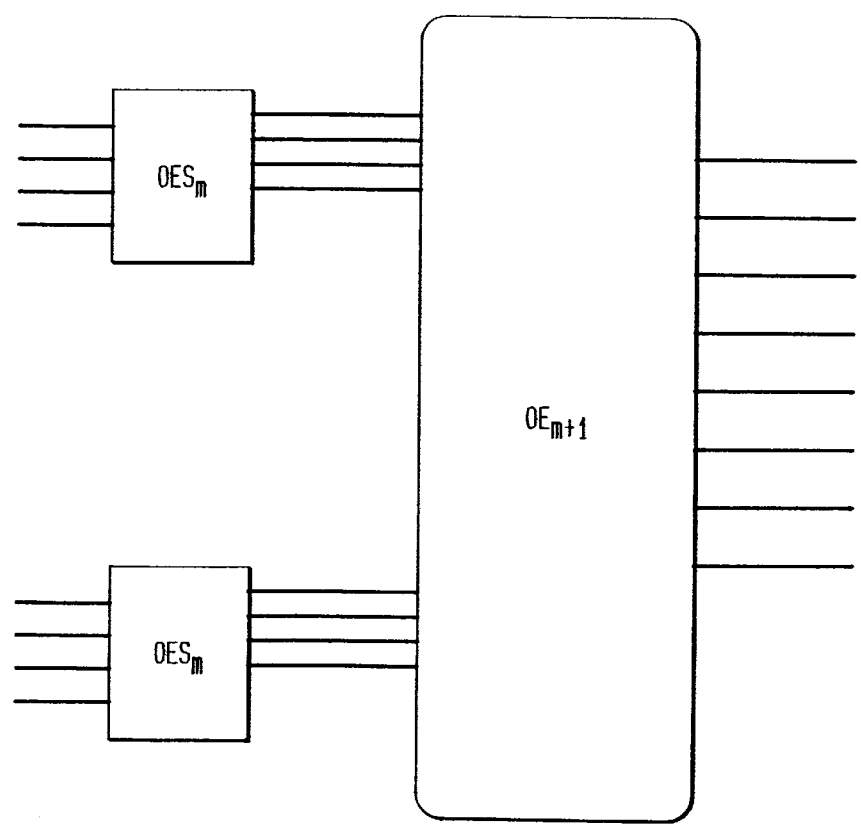
FIG. 18 is a wiring diagram illustrating an exemplary odd-even sorting network.

Using the principles of the above embodiments, the most area-efficient layout for odd-even sorting networks will be diamond-rectangular. FIG. 18 is a wiring diagram illustrating an example of a diamond-rectangular layout for an odd-even sorting network.

As the layout of the odd-even merger $OE_{m+1}$ uses two $OE_m$ mergers followed by a layer of comparators, the wiring between the input nodes of $OE_{m+1}$ and the two mergers $OE_m$ is realized as a butterfly permutation $B_{l,k}$. The wiring between the mergers $OE_m$, $OE_{m-1}$ ... and the layer of comparators is realized as a single butterfly $B_l$.

For any given $k \leq 1$, a butterfly permutation $B_{l,k}$ can be implemented in a grid area of at most $[3L^2/2 + O(L^{3/2})]$. Hence the grid area required for an odd-even merger $OE_{m+1}$ is $[5L^2/2 + O(L^{3/2})]$. Using the diamond-rectangular layout principles of the above embodiments, the grid area for an odd-even sorting networks will be $[5M^2/2 + O(M^{3/2})]$.

In an eighth embodiment, the principles of the present invention are used to create a layout for a bitonic network.

Bitonic networks also use merger networks, although these merger networks have a different structure than odd-even merger networks. $BT_m$ is a merger network with $M=2^m$ inputs. $BT_l$ is a single comparator with 2 inputs. The construction of bitonic merger $BT_{m+1}$ with inputs X[0, ..., 2M−1] comprises two layers. The first layer comprises M comparators ($C_O$, ... $C_{M-1}$). In this layer, a typical comparator $C_i$ has inputs X[i] and X[M+i] for each i. The second layer comprises two bitonic mergers $BT_m$ termed upper and lower. The comparators ($C_O$ ... $C_{M-1}$) and two bitonic mergers $BT_m$ are connected such that the outputs from comparators is directly fed to lower and upper bitonic merger $BT_m$ as inputs.

Figure 19A:
FIGS. 19A, 19B, and 19C are wiring diagrams illustrating a recursive construction of a bitonic merger network with 2, 4, and 8 output lines respectively.
Figure 19B:
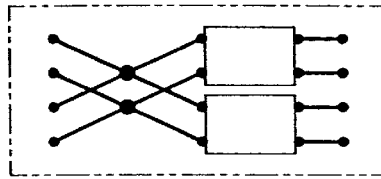
Figure 19C:
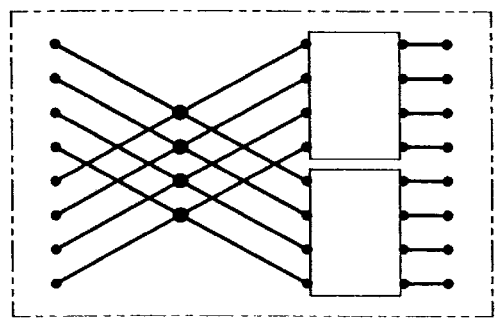

FIG. 19A, 19B, and 19C are wiring diagrams illustrating a recursive construction of a bitonic merger network with 2, 4, and 8 output lines, respectively.

Figure 20:
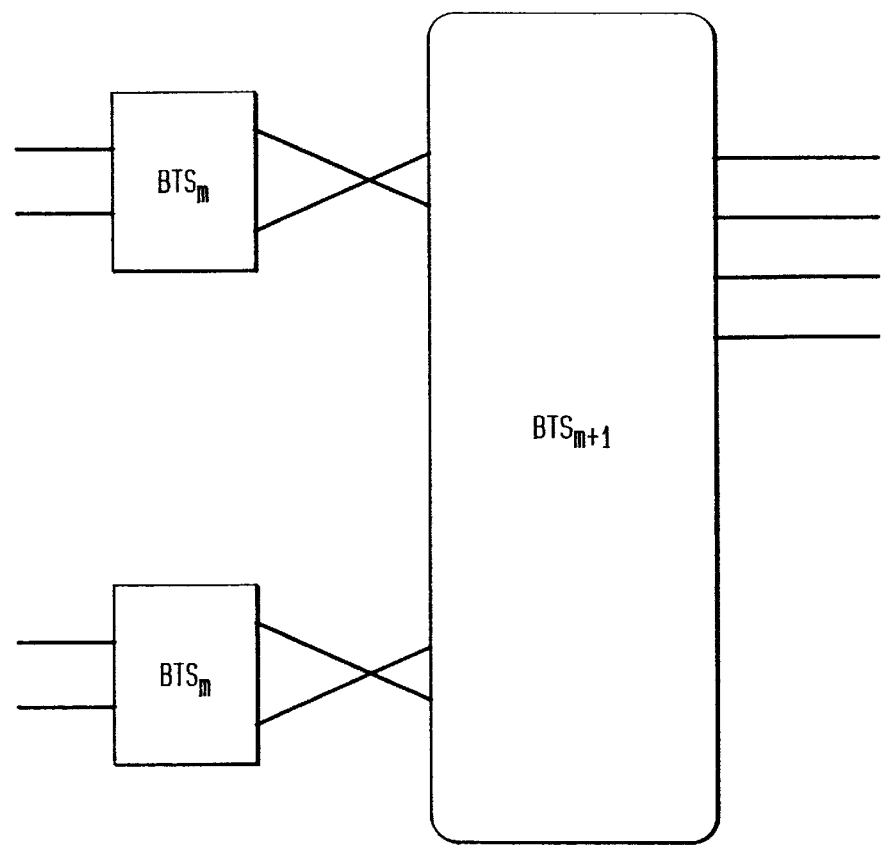
FIG. 20 is a wiring diagram illustrating an exemplary bitonic sorting network.

The bitonic sorting network $BTS_m$ with $M=2^m$ inputs is also constructed recursively. $BTS_l$ is a single comparator. $BTS_{m+1}$ is constructed by feeding the inputs to an upper and a lower $BTS_m$. The M outputs of the upper $BTS_m$ are fed to the M upper inputs of a $BT_{m+1}$, and the M outputs of the lower $BTS_m$ are fed, in the reversed order to the lower, M inputs of the $BT_{m+1}$. The entire sorting network BTS sorts M inputs. FIG. 20 is a wiring diagram illustrating an exemplary bitonic sorter.

In the present embodiment of the invention a rectangular layout is proposed for a bitonic sorting network $BTS_m$. All the principles described in the rectangular layout for butterfly networks are used in this embodiment.

Figure 21:
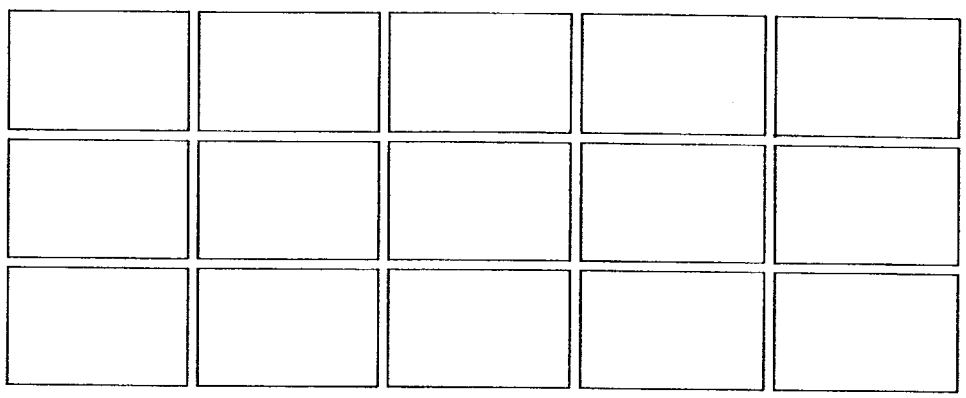
FIG. 21 is a wiring diagram illustrating a rectangular layout, according to the principles of the present invention, for a bitonic sorting network.

FIG. 21 is a wiring diagram illustrating a rectangular layout for an exemplary bitonic sorter $BTS_m$.

The complete bitonic sorter $BTS_m$ layout uses various bitonic mergers $BT_m$, ... $BT_l$. A typical bitonic merger $BT_l$ uses one layer of comparators followed by two $BT_{l-1}$ mergers termed upper and lower. In a typical bitonic merger $BT_l$ the wiring between the input nodes and the layer of comparators is the same wiring as butterfly $B_l$. The wiring between two $BT_{l-1}$ mergers and the first layer of comparators is the same wiring as a butterfly permutation $B_{l,2}$ wherein butterfly permutation $B_{l,2}$ is a concatenation of a single $B_l$ butterfly and two single butterflies $B_{l-1}$.

Hence, the bitonic merger $BT_{l+1}$ uses L+2L−1 columns for $L=2^l$. This implies that the total number of columns $BTS_m$ uses is $[3M+O(1)]$ and the total grid area required is $[3M^2+O(M)]$.

In sum, all the above-mentioned embodiments comprise solutions to a classical problem of creating layouts for different sorting and switching networks on a VLSI chip.

The present invention proposes layouts for various sorting and switching networks, including butterfly, benes, odd-even, and bitonic, on VLSI grids as compactly as possible with minimum grid area requirements. The proposed layouts offer cost-effective, area-efficient layouts making VLSI chips with these layouts cheaper to manufacture.

The present invention is applicable wherever VLSI chips comprising switching and sorting networks are used. Traditionally, telecommunications, parallel computing, and distributed computing industries have been widely using these chips. In recent times, ATM networks with more promising and emerging uses have started to utilize these VLSI chips.

As the production cost of a VLSI chip grows with the total area of its layout, the present invention proposes a design with smaller area further optimized to handle a maximum number of networks in a compact area.

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. The foregoing description is by way of example only, and not limiting. The invention is limited only as defined in the following claims and equivalents thereto.

We claim:

1. A method for determining a layout of a sorting network on a grid model with rows and columns, said method comprising the steps of:

determining a required number of said rows for said sorting network;

determining a required number of said columns for said sorting network;

adding an additional horizontal row to said required number of rows; and designing a layout for said sorting network between said columns and said rows.

2. The method of claim 1, wherein said sorting network is a butterfly network.

3. The method of claim 1, wherein said sorting network is a benes sorting network.

4. The method of claim 1, wherein said sorting network is an odd-even sorting network.

5. The method of claim 1, wherein said sorting network is a bitonic sorting network.

6. A method of determining a layout of a sorting or switching network having N inputs and N outputs on a grid model of rows and columns, said method comprising the steps of:
- (1) selecting N/L butterflies of size L, where L is a number of inputs and a number of outputs of said butterfly and wherein N/L is a number of butterflies comprising said network, each of said inputs comprising a one-input/two-output selector and each of said outputs comprising a two-input/one-output selector, whereby each butterfly comprises 2L rows;
- (2) for each butterfly, mapping grid point (2i+1, 0) to grid point (2i+1, L+1) via a straight connection, where i is an integer between 0 and L−1;
- (3) for each butterfly, mapping grid point (2i, 0) to grid point (i'+2, L+1) using jogs, wherein i' is the number obtained by inverting the two most significant bits of i when i is represented as a binary number; and
- (4) combining said N/L butterflies to form said network.

7. The method of claim 6 wherein step (2) comprises assigning said jogs to columns f(r) where:
$f(r)=L-2i+1$, for connections that start in rows 4i, and $f(r)=L-(rl'^k/2)+1$ for connections that start in rows 4i+2.

8. The method of claim 7 further comprising the step of:
- (5) between steps (3) and (4), for each butterfly, adding downslots to row 0; and
- (6) between steps (3) and (4), for each butterfly, adding upslots to row 2L.

9. The method of claim 8 wherein step (5) comprises adding a downslot to a different row for each pair of adjacent columns and step (6) comprises adding an upslot to a different row for each pair of adjacent columns.

10. The method of claim 9 wherein step (4) comprises concatenating said N/L butterflies in a manner wherein each butterfly shares its bottom-most row with a top-most row of a butterfly below it.

11. The method of claim 10 further comprising the steps of:
- (7) after step (3) and before steps (5) and (6), for each butterfly, partitioning said butterfly into quadrants; and
- (8) for each quadrant of each butterfly, iteratively exchanging the top-most row of said quadrant with the row containing the down-jog of the top-most upslot in said quadrant.

* * * * *